(12) United States Patent
Lu et al.

(10) Patent No.: US 10,763,382 B2
(45) Date of Patent: Sep. 1, 2020

(54) BACKSIDE CONFIGURED SURFACE PLASMONIC STRUCTURE FOR INFRARED PHOTODETECTOR AND IMAGING FOCAL PLANE ARRAY ENHANCEMENT

(71) Applicant: University of Massachusetts, Boston, MA (US)

(72) Inventors: Xuejun Lu, Chelmsford, MA (US); Guiru Gu, Lowell, MA (US); Puminun Vasinajindakaw, Wakefield, MA (US)

(73) Assignee: University of Massachusetts, Boston, MA (US)

( * ) Notice: Subject to any disclaimer, the term of this patent is extended or adjusted under 35 U.S.C. 154(b) by 0 days.

(21) Appl. No.: 16/401,626

(22) Filed: May 2, 2019

(65) Prior Publication Data

US 2019/0259890 A1    Aug. 22, 2019

Related U.S. Application Data

(62) Division of application No. 15/695,716, filed on Sep. 5, 2017, now Pat. No. 10,326,035, which is a division of application No. 15/287,148, filed on Oct. 6, 2016, now Pat. No. 9,780,240, which is a division of application No. 14/227,607, filed on Mar. 27, 2014, now Pat. No. 9,537,027.

(60) Provisional application No. 61/806,098, filed on Mar. 28, 2013.

(51) Int. Cl.
*H01L 31/18* (2006.01)
*H01L 31/0352* (2006.01)
*H01L 27/144* (2006.01)
*H01L 31/0232* (2014.01)
*H01L 31/09* (2006.01)

(52) U.S. Cl.
CPC .. *H01L 31/035218* (2013.01); *H01L 27/1443* (2013.01); *H01L 27/1446* (2013.01); *H01L 31/02327* (2013.01); *H01L 31/09* (2013.01)

(58) Field of Classification Search
CPC ............ H01L 31/18; H01L 31/035209; H01L 31/035218; H01L 31/035236
USPC .... 250/216, 214.1, 338.1, 338.4; 257/14, 21
See application file for complete search history.

(56) References Cited

U.S. PATENT DOCUMENTS

| | | | |
|---|---|---|---|
| 6,239,449 B1 | 5/2001 | Fafard et al. | 257/17 |
| 6,906,326 B2 | 6/2005 | Koch et al. | 250/338.4 |
| 9,520,514 B2 * | 12/2016 | Lee | H01L 31/035218 |
| 9,537,027 B2 * | 1/2017 | Lu | H01L 27/1443 |
| 2014/0175546 A1 | 6/2014 | Huffaker et al. | 257/342 |
| 2014/0291479 A1 | 10/2014 | Lu et al. | 250/200 |

OTHER PUBLICATIONS

Atwater, H. A. et al. (2010) "Plasmonics for improved photovoltaic devices," *Nature Materials* 9(3), 205-213.

(Continued)

*Primary Examiner* — Kevin K Pyo
(74) *Attorney, Agent, or Firm* — Medlen & Carroll, LLP

(57) ABSTRACT

The invention relates to quantum dot and photodetector technology, and more particularly, to quantum dot infrared photodetectors (QDIPs) and focal plane array. The invention further relates to devices and methods for the enhancement of the photocurrent of quantum dot infrared photodetectors in focal plane arrays.

3 Claims, 11 Drawing Sheets

(56) References Cited

OTHER PUBLICATIONS

Barnes, W. L. (2006) "Surface plasmon—polariton length scales: a route to sub-wavelength optics" *Journal of Optics A: Pure and Applied Optics* 8(4), S87-S93.
Bhattacharya, P. et al. (2004) "Quantum Dot Opto-Electronic Devices," *Annual Review of Materials Research* 34(1), 1-40.
Bhattacharya, P. et al. (2005) "Characteristics of a tunneling quantum-dot infrared photodetector operating at room temperature," *Applied Physics Letters* 86, 191106.
Catchpole, K. R. et al. (2008) "Plasmonic solar cells," *Optics Express* 16(26), 21793-21800.
Chakrabarti, S. et al. (2004) "High-Temperature Operation of InAs—GaAs Quantum-Dot Infrared Photodetectors With Large Responsivity and Detectivity," *IEEE Photonics Technology Letters* 16, 1361-1363.
Chang, C.-C. et al. (2010) "A Surface Plasmon Enhanced Infrared Photodetector Based on InAs Quantum Dots," *Nano Letters* 10(5), 1704-1709.
Chang, S.-H. et al. (2005) "Surface plasmon generation and light transmission by isolated nanoholes and arrays of nanoholes in thin metal films," *Optics Express* 13(8), 3150-3165.
Chi-Yang, C. et al. (2007) "Wavelength selective quantum dot infrared photodetector with periodic metal hole arrays," *Applied Physics Letters* 91(16), 163107.
Coe, J. V. et al. (2008) "Extraordinary Transmission of Metal Films with Arrays of Subwavelength Holes," *Annual Review of Physical Chemistry* 59(1), 179-202.
Dumas, J. M. et al. (1985) "Comparative reliability study of GaAs power MESFETs: mechanisms for surface-induced degradation and a reliable solution," *Electronics Letters* 21(3), 115-116.
Ebbesen, T. W. et al. (1998) "Extraordinary optical transmission through sub-wavelength hole arrays," *Nature* 391(6668), 667-669.
Eker, S. U. et al. (2008) "Large-Format Voltage-Tunable Dual-Band Quantum-Well Infrared Photodetector Focal Plane Array for Third-Generation Thermal Imagers," *IEEE Electron Device Letters* 29(10), 1121-1123.
Ferry, V. E. et al. (2008) "Plasmonic Nanostructure Design for Efficient Light Coupling into Solar Cells," *Nano Letters* 8(12), 4391-4397.
Ferry, V. E. et al. (2010) "Light trapping in ultrathin plasmonic solar cells," *Optics Express* 18(S2), A237-A245.
Genet, C. et al. (2007) "Light in tiny holes," *Nature* 445(7123), 39-46.
Ghaemi, H. F. et al. (1998) "Surface plasmons enhance optical transmission through subwavelength holes," *Physical Review B* 58(11), 6779-6782.
Gunapala, S. et al. (2007) "640x512 Pixels long-wavelength infrared (LWIR) quantum-dot infrared photodetector (QDIP) imaging focal plane array," *IEEE Journal of Quantum Electronics* 43(3), 230-237.
Homola, J. et al. (1999) "Surface plasmon resonance sensors: review," *Sensors and Actuators B: Chemical* 54(1-2), 3-15.
Jestl, M. et al. (1989) "Polarization-sensitive surface plasmon Schottky detectors," *Optics Letters* 14(14), 719-721.
Jiang, L. et al. (2003) "In0.6Ga0.4As/GaAs quantum-dot infrared photodetector with operating temperature up to 260 K," *Applied Physics Letters* 82, 1986-1988.
Jin, Z. et al. (2005) "Passivation of InP/GaAsSb/InP double heterostructure bipolar transistors with ultra thin base layer by low-temperature deposited SiNx," *Solid-State Electronics* 49(3), 409-412.
Jin, Z. et al. (2004) "Current gain increase by SiNx passivation in self-aligned InGaAs/InP heterostructure bipolar transistor with compositionally graded base," *Solid-State Electronics* 48(9), 1637-1641.
Kim, E.-T. et al. (2004) "High detectivity InAs quantum-dot infrared photodetectors," *Applied Physics Letters* 84, 3277-3279.

Krishna, S. (2011) "Quantum Dot Focal Plane Array with Plasmonic Resonator," *Proceedings of SPIE—The International Society for Optical Engineering* 8095, 809506.
Krishna, S. et al. (2007) "Quantum Dot Based Infrared Focal Plane Arrays," *Proceedings of the IEEE* 95(9), 1838-1852.
Krishnan, A. et al. (2001) "Evanescently coupled resonance in surface plasmon enhanced transmission," *Optics Communications* 200(1-6), 1-7.
Lee, D. H. et al. (1988) "A study of the surface passivation on GaAs and $In_{0.53}Ga_{0.47}As$ Schottky-barrier photodiodes using $SiO_2$, $Si_3N_4$ and polyimide," *IEEE Transactions on Electron Devices* 35(10), 1695-1696.
Lee, S. C. et al. (2009) "Quantum dot infrared photodetector enhanced by surface plasma wave excitation," *Optics Express* 17(25), 23160-23168.
Lee, S. C. et al. (2010) "Light direction-dependent plasmonic enhancement in quantum dot infrared photodetectors," *Applied Physics Letters* 97(2), 021112-021113.
Lee, S. C. et al. (2011) "Plasmonic-Enhanced Photodetectors for Focal Plane Arrays," *IEEE Photonics Technology Letters* 23(14), 935-937.
Lee, S. J. et al. (2011) "A monolithically integrated plasmonic infrared quantum dot camera," *Nature Communications* 2, 286.
Levine, B. F. (1993) "Quantum-well infrared photodetector," *Journal of Applied Physics* 74(8), R1-R81.
Li, X. (2010) Dark current characterization and analysis of long wavelength infrared photodetectors based on type-II quantum dots, in *Department of Nanoelectronics*, Acreo, Stockholm, Sweden.
Lim, H. et al. (2007) "High-performance InAs quantum-dot infrared photodetectors grown on InP substrate operating at room temperature," *Applied Physics Letters* 90, 131112.
Liu, H. C. (2003) "Quantum dot infrared photodetector," *Opto-Electronics Review* 11(1), 1-5.
Liu, N. et al. (2010) "Infrared Perfect Absorber and Its Application As Plasmonic Sensor," *Nano Letters* 10(7), 2342-2348.
Lu, X. et al. (2007) "Temperature-dependent photoresponsivity and high-temperature (190 K) operation of a quantum dot infrared photodetector," *Applied Physics Letters* 91(5), 051115.
Maier, S. A. (2007) Plasmonics fundamentals and applications, Springer, New York.
Maier, S. A. et al. (2005) "Plasmonics: Localization and guiding of electromagnetic energy in metal/dielectric structures," *Journal of Applied Physics* 98(1), 011101-011110.
Matsui, T. et al. (2007) "Transmission resonances through aperiodic arrays of subwavelength apertures," *Nature* 446(7135), 517-521.
Murray, W. A. et al. (2007) "Plasmonic Materials," *Advanced Materials* 19(22), 3771-3782.
Ordal, M. A. et al. (1983) "Optical properties of the metals Al, Co, Cu, Au, Fe, Pb, Ni, Pd, Pt, Ag, Ti, and W in the infrared and far infrared," *Applied Optics* 22(7), 1099-1119.
Parsons, J. et al. (2009) "Localized surface-plasmon resonances in periodic nondiffracting metallic nanoparticle and nanohole arrays," *Physical Review B* 79(7), 073412.
Popov, E. et al. (2000) "Theory of light transmission through subwavelength periodic hole arrays," *Physical Review B* 62(23), 16100-16108.
Rogalski, A. (2012) "Progress in focal plane array technologies," *Progress in Quantum Electronics* 36(2-3), 342-473.
Salomon, L. et al. (2001) "Near-Field Distribution of Optical Transmission of Periodic Subwavelength Holes in a Metal Film," *Physical Review Letters* 86(6), 1110-1113.
Song, H. J. et al. (2009) "Analysis of surface dark current dependent upon surface passivation in APD based on GaAs," *Semiconductor Science and Technology* 24, 5.
Song, H. J. et al. (2009) "Comparative analysis of dark current between $SiN_x$ and polyimide surface passivation of an avalanche photodiode based on GaAs," *Semiconductor Science and Technology* 24, 5.
Stiff-Roberts, A. D. (2009) "Quantum-dot infrared photodetectors: a review," *Journal of Nanophotonics* 3, 031607-031617.
Tan, C. L. et al. (2009) $Si_3N_4$ / $SiO_2$ passivation layer on InP for optimization of the 1.55um MQW FP laser performance, in *Numeri-*

(56) References Cited

OTHER PUBLICATIONS cal Simulation of Optoelectronic Devices, 2009. NUSOD 2009. 9th International Conference on, pp. 91-92.

Tidrow, M. Z. (2000) "Device physics and state-of-the-art of quantum well infrared photodetectors and arrays," *Materials Science and Engineering B* 74(1-3), 45-51.

Tsao, S. et al. (2007) "High operating temperature 320×256 middle-wavelength infrared focal plane array imaging based on an InAs/InGaAs/InAlAs/InP quantum dot infrared photodetector," *Applied Physics Letters* 90(20), 201109.

Vaillancourt, J. et al. (2011) "High Operating Temperature (Hot) Middle Wave Infrared (MWIR) Quantum-Dot Photodetector," *Optics and Photonics Letters* 4(2), 57-61.

Vasinajindakaw, P. (2009) Verification and Reduction of Dark Current on Quantum Dot Infrared photodetector, in *Electrical & Computer Engineering*, Univerisity of Massachusetts at Lowell, Lowell.

Vasinajindakaw, P. (2012) Surface plasmon enhanced quantum dot infrared photodetector, in *Electrical & Computer Engineering*, p. 70, University of Massachusetts at Lowell, Lowell.

Vasinajindakaw, P. et al. (2012) "Surface plasmonic enhanced polarimetric longwave infrared photodetection with band pass spectral filtering," *Semiconductor Science and Technology* 27(6), 65005-65009.

Vasinajindakaw, P. et al. (2011) "A Fano-type interference enhanced quantum dot infrared photodetector," *Applied Physics Letters* 98(21), 211111.

Vuckovic, J. et al. (2000) "Surface plasmon enhanced light-emitting diode," *IEEE Journal of Quantum Electronics* 36(10), 1131-1144.

Xudong, J. et al. (1999) "Investigation of a multistack voltage-tunable four-color quantum-well infrared photodetector for mid- and long-wavelength infrared detection," *IEEE Journal of Quantum Electronics* 35(11), 1685-1692.

Yu, N. et al. (2008) "Quantum cascade lasers with integrated plasmonic antenna-array collimators," *Optics Express* 16(24), 19447-19461.

* cited by examiner

UML0273 Structure

Backside illumination

BACKSIDE CONFIGURED SURFACE PLASMONIC STRUCTURE FOR INFRARED PHOTODETECTOR AND IMAGING FOCAL PLANE ARRAY ENHANCEMENT

CROSS-REFERENCE TO RELATED APPLICATIONS

The present application is a Divisional of, and claims priority to, co-pending U.S. patent application Ser. No. 15/695,716, filed Sep. 5, 2017, which claims priority to U.S. patent application Ser. No. 15/287,148, filed Oct. 6, 2016, now issued as U.S. Pat. No. 9,780,240 issued Oct. 3, 2017, which claims priority to U.S. patent application Ser. No. 14/227,607, filed Mar. 27, 2014, now issued as U.S. Pat. No. 9,537,027 issued Jan. 3, 2017, which claims priority to Provisional Application Ser. No. 61/806,098 filed on Mar. 28, 2013, the contents of which are incorporated herein in their entirety.

STATEMENT OF PRIVATE FUNDING SUPPORT

This invention was made with private funding support from AFOSR under grant number FA9550-10-1-0016 and grant number FA9550-12-1-0176 and with private funding support from Applied NanoFemto Technologies under grant number S51330000013397 and with private funding support from AFOSR under grant STTE Phase 1 subcontract. These private entities have certain rights in the invention.

FIELD OF THE INVENTION

The invention relates to quantum dot and photodetector technology, and more particularly, to quantum dot infrared photodetectors (QDIPs) and focal plane array. The invention further relates to devices and methods for the enhancement of the photocurrent of quantum dot infrared photodetectors in focal plane arrays.

BACKGROUND OF THE INVENTION

Quantum dot infrared photodetectors (QDIPs) based on intersubband transitions in self-assembled InAs quantum dots (QDs) have been extensively researched for middle-wave infrared (MWIR, 3-5 μm) and longwave infrared (LWIR, 8-12 μm) photodetection and imaging [1-8]. The three-dimensional (3D) quantum confinement structure provides advantages, such as normal incidence photodetection [1, 2], lower dark current [5], high photoreponsitivities [8], and high operating temperature [3-5, 8]. In fact, so far, only the QDIP technology has been reported to have a high operating temperature of over 298 K [5, 9-11]. The major issue of the QDIP technology, however, is that the total number of QD layers that can be stacked in a QDIP is limited by the accumulation of strain and the strain induced defects and dislocations. This leads to a thin active QD absorption region, which results in a low percentage of light that can be absorbed in the active region. What is currently needed are techniques for employing QDIP technology in focal plane array applications wherein the QDIP has increased detectivity to match and exceed the performance of current IR detectors.

SUMMARY OF THE INVENTION

The invention relates to quantum dot and photodetector technology, and more particularly, to a quantum dot infrared photodetector and focal plane array. The invention further relates to devices and methods for the enhancement of the photocurrent quantum dot infrared photodetectors in focal plane array.

In one embodiment, the present invention contemplates focal plane array device containing backside configured surface plasmon polaritons (SPP) structures. In one embodiment, said SPP structure is within the quantum dot infrared photodetector. In one embodiment, said SPP structure comprises plasmonics near-field effect. In one embodiment, the SPP structure is configured on the backside of the QDIP. In one embodiment, the plasmonics near-field effect comprises an enhanced photocurrent. In one embodiment, a passivation layer is deposited on top of the SPP structure further comprises a passivation layer. In one embodiment, the passivation layer comprises an enhanced near-field effect resonance. In one embodiment, the passivation layer comprises a reduced FPA surface dark current.

In one embodiment, the invention relates to a backside configured focal plane array device comprising: (a) a semi-insulating substrate; (b) a first contacting layer in direct and continuous contact with said semi-insulating substrate; (c) a set of first metal contacts in direct contact with said first contacting layer, (d) a second contacting layer; (e) a series of quantum dot layers disposed between said first contacting layer and said second contacting layer; (e) surface plasmon polaritons structures in direct contact with said second contacting layer; (f) a silicon nitride ($SiN_x$) passivation layer deposited over said surface plasmon polaritons structures; (g) a second metal contact in contact with said second contacting layer; and (h) an indium bump in contact with said a $SiN_x$ passivation layer deposited over said surface plasmon polaritons structures and said second metal contact. In one embodiment, said semi-insulating substrate comprises GaAs. In one embodiment, the $SiN_x$ passivation layer upon the backside of said series of quantum dot layers is also between said first contacting layer and said second contacting layer, said second contacting layer, and said second metal contact in contact with said second contacting layer and covers the sidewall of the photodetector. In one embodiment, the quantum dot layers are comprised of gallium, indium, aluminum and arsenic. In one embodiment, the device is capable of normal incidence detection. In one embodiment, there is a buffer layer between said first contacting layer and said series of quantum dot layers. In one embodiment, there is a buffer layer between said second contacting layer and said series of quantum dot layers.

In one embodiment, the invention contemplates a backside configured focal plane array device comprising: (a) a series of quantum dot layers disposed between a first contacting layer and a second contacting layer; (b) back side configured surface plasmon polaritons (SPP) structures in direct contact with said second contacting layer; (c) a $SiN_x$ passivation layer deposited over said surface plasmon polaritons structures; (d) a metal contact in contact with said second contacting layer; and (e) an indium bump in contact with said a silicon nitride passivation layer deposited over said surface plasmon polaritons structures and said metal contact.

In one embodiment, the invention contemplates a method of enhancing the photocurrent spectrum response of a quantum dot infrared photodetector by at least four times comprising: (a) increasing the photocurrent with an surface plasmon structure integrated into said photodetector, and (b) decreasing the dark current with a silicon nitride passivation layer. In one embodiment, the photocurrent is enhanced by at least sixteen times. In one embodiment, the quantum dot infrared photodetector is part of a focal plane array.

In one embodiment, the invention contemplates a backside configured quantum dot infrared focal plane array device comprising an array of pixels. In one embodiment, each pixel of said focal plane array has a series of quantum dot layers disposed between a first contacting layer and a second contacting layer; a metal contact in contact with said second contacting layer; and an indium bump in contact with said metal contact; wherein the improvement comprises: a) surface plasmon polaritons structure in contact a contacting layer, and b) a passivation layer which covers said surface plasmon polariton structure and is in contact with said indium bump and metal contact and covers the sidewall of the contacting layers, buffer layers, and QDIP layer, and (c) fabricating the surface polariton structures is the first step in the focal plane array fabrication process.

In one embodiment, the invention contemplates a backside configured plasmonic polariton enhanced infrared photodetector and focal plane array devices having a series of quantum dot layers disposed between a first contacting layer and a second contacting layer; a metal contact in contact with said second contacting layer; and an indium bump in contact with said metal contact; wherein the improvement comprises: a) surface plasmon polaritons structure in contact a contacting layer, and b) a passivation layer which covers said surface plasmon polaritions structure and is in contact with said indium bump and metal contact, and c) a passivation layer which covers the sidewall of the contacting layers, buffer layers, and QDIP layer. In one embodiment, the device further comprises d) wherein the surface plasmonic polariton structure is configured on the opposite side of the substrate, and the light incident is upon on the substrate side (front side). In one embodiment, the device further comprises e) wherein the surface plasmonic polariton structures are first fabricated before the fabrication of the pixels of the FPA.

In one embodiment, the invention contemplates a method of producing a focal plane array comprising, a) formation of a two dimensional hole array (2DHA) plasmonic structure upon a QDIP structure using photolithography, followed by deposition of metal (75(best)30 nm gold) to form a mesa, b) patterning of said mesa using photolithography, followed by wet etch stopping at the bottom contact layer of said QDIP structure, c) formation of ohmic contacts, d) deposition of a passivation layer, e) opening of a connection to the ohmic contact through passivation layer, f) patterning and deposition of an indium bump, and h) hybridization of said indium bumps to a read out integration circuit.

Even though the experimental data are based on QD infrared detectors, in one embodiment, the invention can be used for any kind of detectors and FPAs for performance enhancement.

Definitions

To facilitate the understanding of this invention, a number of terms are defined below. Terms defined herein have meanings as commonly understood by a person of ordinary skill in the areas relevant to the present invention. Terms such as "a", "an" and "the" are not intended to refer to only a singular entity, but include the general class of which a specific example may be used for illustration. The terminology herein is used to describe specific embodiments of the invention, but their usage does not delimit the invention, except as outlined in the claims.

As used herein, the term "backside configured" refers to a device is configured such that the surface plasmonic polariton structure is configured on the opposite side of the substrate, and the light incident is upon on the substrate side, which is referred to as the "front side".

As used herein, the term "quantum dot infrared photodetector" refers to an infrared photodetector using quantum dots (QD) as the active infrared absorption material.

As used herein, the term "focal plane array" refers to image sensing device consisting of an array (typically square) of light-sensing pixels at the focal plane.

As used herein, the term "semi-insulating substrate" refers to an undoped GaAs substrate that does not conduct electricity.

As used herein, the term "contacting layer" refers to an n-type doped GaAs layer on which one puts electrodes of the QDIP.

As used herein, the term "buffer layer" refers to an undoped GaAs layer that one grow to improve the quality of the material.

As used herein, the term "metal contact" refers to electrode for the QDIPs and FPAs As used herein, the term "QDIP layer" refers to all the layers of the photodetectors without the electrodes and the surface plasmonic polariton structure.

As used herein, the term "surface plasmons polaritons (SPP)" refers to light induced packets of electrical charges that collectively oscillate at the surfaces of metals. Under specific conditions, light that radiates on the object (incident light) can excite the surface plasmon polaritons (SPPs). SPPs are guided along metal-dielectric interfaces. SPPs can provide a significant increase in spatial confinement that beyond the diffraction limit and local field intensity.

As used herein, the term "$SiN_x$" refers to the silicon nitride passivation material As used herein, the term "indium bump" refers to a block of indium, in a preferred embodiment the block of indium has a dimension of 20 micrometer×20 micrometer and height of 10 micrometer.

As used herein, the term "pixel" refers to an individual light sensing element often within the context of a larger device or a focal plane array.

As used herein, the term "normal incidence detection" refers to the incident of the infrared light is from the substrate side (also referred to as the "front side"). The normal incidence is also refer to as "forward looking".

DESCRIPTION OF THE FIGURES

The accompanying figures, which are incorporated into and form a part of the specification, illustrate several embodiments of the present invention and, together with the description, serve to explain the principles of the invention. The figures are only for the purpose of illustrating a preferred embodiment of the invention and are not to be construed as limiting the invention.

DESCRIPTION OF THE INVENTION

Figure 1:
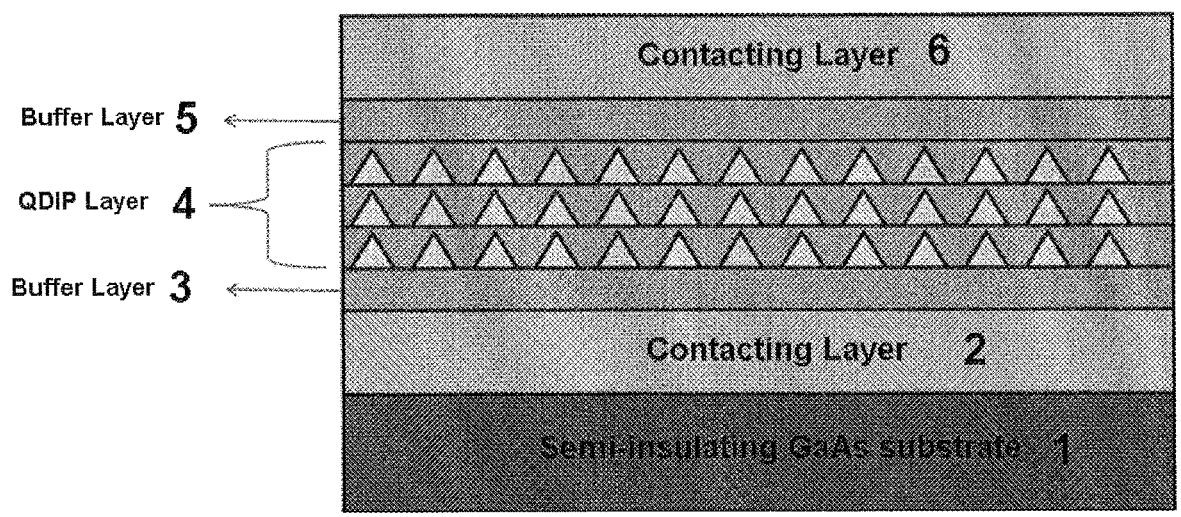
FIG. 1 shows the standard MBE growth structure cross-section.

The invention relates to quantum dot and photodetector technology, and more particularly, to a quantum dot infrared photodetectors and focal plane arrays. The invention further relates to devices and methods for the enhancement of the photocurrent response of quantum dot infrared photodetectors and focal plane array.

In one embodiment, the present invention contemplates a quantum dot infrared photodetector (QDIP) focal plane array (FPA) with backside configured Surface Plasmon Polaritons (SPP) structure. SPP structures are capable of enhanced photocurrent by creating plasmonics near-field effect and create a multispectral sensing system. A passivation layer may be deposited on top of SPP structure in order to enhance the resonance of near-field effect as well as reduce the surface dark current on FPA. This embodiment can enhance the responsivity together with the detectivity of QDIP and FPA and the multispectral detector. The backside configured plasmonic structure reduces the fabrication difficultness and the cost.

There have been many reported advances in the area of infrared photodetectors. For example, Vasinajindakaw, et al. (2011) [12], discloses a quantum dot photodetector enhanced by Fano-type interference in a metallic two-dimensional (2D) subwavelength hole array (2DSHA).

The photocurrent enhancement wavelength shows an offset from the plasmonic resonant peak and corresponds to a dip in the transmission spectrum of the 2DSHA structure. The offset is attributed to the Fano-type interference in the 2DSHA structure. The asymmetric line shapes of the plasmonic resonance are analyzed and agree well with the two-peak Fano-type interference model. Over 100% enhancement in photodetectivity and photoresponsivity is achieved at the wavelength of the Fano dip of the first order plasmonic mode. This reference does not teach the same photodetector array as described in one embodiment of the current invention, particularly not including the surface passivation.

Another reference, Rogalski (2012) [13], discloses a wide review of advancements in the field of focal plane array technologies. The general design of the QDIP portion of the focal plane array is described, but is not backside configured. Additionally, the reference teaches that surface passivation can be problematic and that typically used materials include: silicon nitride, silicon oxides, ammonium sulphide, and aluminium gallium antimonide alloys. This reference does not describe backside configuration of the QDIP or the inclusion of surface plasmon structures layered above the contact layer and QDIP layers described in one embodiment of the current invention.

Another reference describes that the $SiN_x$ passivation layer helps improve the performance of QDIP (Vasinajindakaw (2009) [14]). However, this reference does not describe backside configuration of the QDIP or the inclusion of surface plasmon structures layered above the contact layer and QDIP layers described in one embodiment of the current invention.

Another reference discloses a quantum dots-in-a-well (DWELL) focal plane array with surface plasmon structures (Krishna (2011) [15]). The reference also mentions that 200 nm thick $Si_3N_4$ was deposited for surface passivation using plasma enhanced chemical vapor deposition (PECVD). Surface plasmon structures were also included in the array. However the positioning of the surface plasmon structures is not the same as described in one embodiment of the current invention. This reference also does not describe backside configuration of the QDIP or the inclusion of surface plasmon structures layered above the contact layer and QDIP layers described in the current invention. The reference does not describe the inclusion in any focal plane array structure.

Another reference discloses a quantum-well infrared photodetector focal plane array (Eker, (2008) [16]), not a backside configured of the QDIP or the inclusion of surface plasmon structures layered above the contact layer and QDIP layers described in one embodiment of the current invention.

Another reference discloses various advances in the field of long wavelength infrared quantum dot photodetectors and infrared quantum dot photodetector focal plane arrays (Li (2010) [17]). The reference describes various passivation techniques (including $Si_3N_4$) are used to reduce dark current effects. This reference also does not describe backside configuration of the QDIP or the inclusion of surface plasmon structures layered above the contact layer and QDIP layers described in one embodiment of the current invention.

Another reference discloses a focal plane array with plasmonic enhancement of a quantum-dot infrared photodetector (QDIP) using a corrugated metal surface (CMS) (Lee (2011) [18]). Passivation is described as an Au (gold) film, rather than $SiN_x$ passivation. This reference also does not describe backside configuration of the QDIP or the inclusion of surface plasmon structures layered above the contact layer and QDIP layers described in one embodiment of the current invention.

Another reference discloses a quantum dot infrared photodetector focal plane array, U.S. Pat. No. 6,906,326 [19]. Elements not discussed are the inclusion of surface plasmons and the inclusion of a passivation layer. This reference also does not describe backside configuration of the QDIP or the inclusion of surface plasmon structures layered above the contact layer and QDIP layers described in one embodiment of the current invention.

Another reference discloses that plasmonic enhancement of a quantum dot infrared photodetector (QDIP) integrated with a metal photonic crystal (MPC) depends on the direction of the incident light, air-side versus substrate-side illumination (Lee et al. (2010) [20]). Compared with air-side illumination, substrate-side illumination on the same photodetector results in more than two times enhancement in detectivity. This is explained by more efficient excitation of surface plasma waves (SPWs) at the MPC/QDIP interface in the back-side geometry. The air/MPC/semiconductor structure is optically asymmetric and has different SPW coupling leading to higher photoresponse for substrate-side illumination. This agrees with simulation and provides direct evidence that the detectivity enhancement is due to the coupling to SPWs and is crucially affected by light incident direction. The reference further describes that for better comparison, substrate removal for closer proximity between an air-side and a substrate-side aperture, and metal passivation over extra openings for equal irradiance in both air-side illumination (ASI) and substrate-side illumination (SSI) are required. This reference also does not describe the inclusion of surface plasmon structures layered above the contact layer and QDIP layers described in one embodiment of the current invention. The reference does not include the passivation layer. The reference also does not describe the inclusion in focal plane arrays.

ADDITIONAL BACKGROUND OF THE INVENTION

A photodetector is a device that converts the electromagnetic field, such as visible light or infrared light, into electrical signal. In the infrared (IR) regime, photodetectors can be categorized into two groups. The first group includes thermal detectors that detect heat. One such thermal detector, which based on thermal conductor effect, is called a bolometer. A bolometer is a device for measuring the power of incident electromagnetic radiation via the heating of a material with a temperature-dependent electrical resistance. Another, thermal detector, which based on thermoelectric effect, is called thermopile. A thermopile is an electronic device that converts thermal energy into electrical energy. It is composed of several thermocouples connected usually in series or, less commonly, in parallel. The second group includes photo detectors that detect electromagnetic radiation. The detection is based on the principle of quantum mechanics. Photo detectors can be categorized into two types depend on the transition of electron on the band structure, one is an interband transition photodetector and the other is an intersubband transition photodetector.

The interband transition photodetector employs the transition of electromagnetic radiation, which creates excess electron-hole pair in the conduction band and valance band. The current state of the art of interband transition photodetector is mercury cadmium telluride (MCT, HgCdTe). By using growth techniques such as liquid phase epitaxy (LPE) or molecular beam epitaxy (MBE), the composition can be changed in the form of $Hg_{1-x}Cd_xTe$. Spectral range of $Hg_{1-x}Cd_xTe$ can be designed to cover in SWIR range, MWIR range, or LWIR range. MCT has fast response time and high sensitivity compare to other IR detectors. However, the cost is relatively high and its noise current is high so that its application of LWIR needs to be cooled down to temperature near 77K to reduce noise in the device.

The intersubband transition photodetector employs only one band such as conduction band. By manipulating the band structure with precise control of MBE deposition; one can create the intersubband transition of electron on the conduction band. Photodetector based on intersubband transition are quantum well infrared photodetector (QWIP) and Quantum Dot photodetector (QDIP).

QWIP have several advantages over other IR detector. First, a QWIP has low cost and good uniformity compared to other IR detectors. Second, it offers high sensitivity with wavelength flexibility in mid-wavelength infrared (MWIR) and long-wavelength infrared (LWIR) regions [21]. Third, it has multicolor capability over the other IR detectors [21]. However, QWIP still have the disadvantage due to its inability to absorb normal incident radiation [22].

QDIP was developed from QWIP. The basic principle operation of QDIP is quite similar to QWIP. QDIP offers several advantages. QDIP also has multicolor capability. QDIP has three dimensional quantum confinements which enable sensitivity on normal incident radiation [11]. Moreover, QDIP also has a lower dark current than a QWIP since the density of states in quantum dot are much lower than that in quantum well, which allows QD to hold less thermally-generated electrons [23]. In addition, QDIP has long excited state lifetime which allows efficient collection of photo-excited carriers and this leads to high photoconductive gain [23]. However, QDIP detectivity is still lower than that of QWIP. This leads to further inconvenience which appears that QDIP has to operate at low temperature. Therefore, there is need for QDIP to increase its detectivity to match and exceed the performance of current IR detectors.

DETAILED DESCRIPTION OF THE INVENTION

Figure 2:
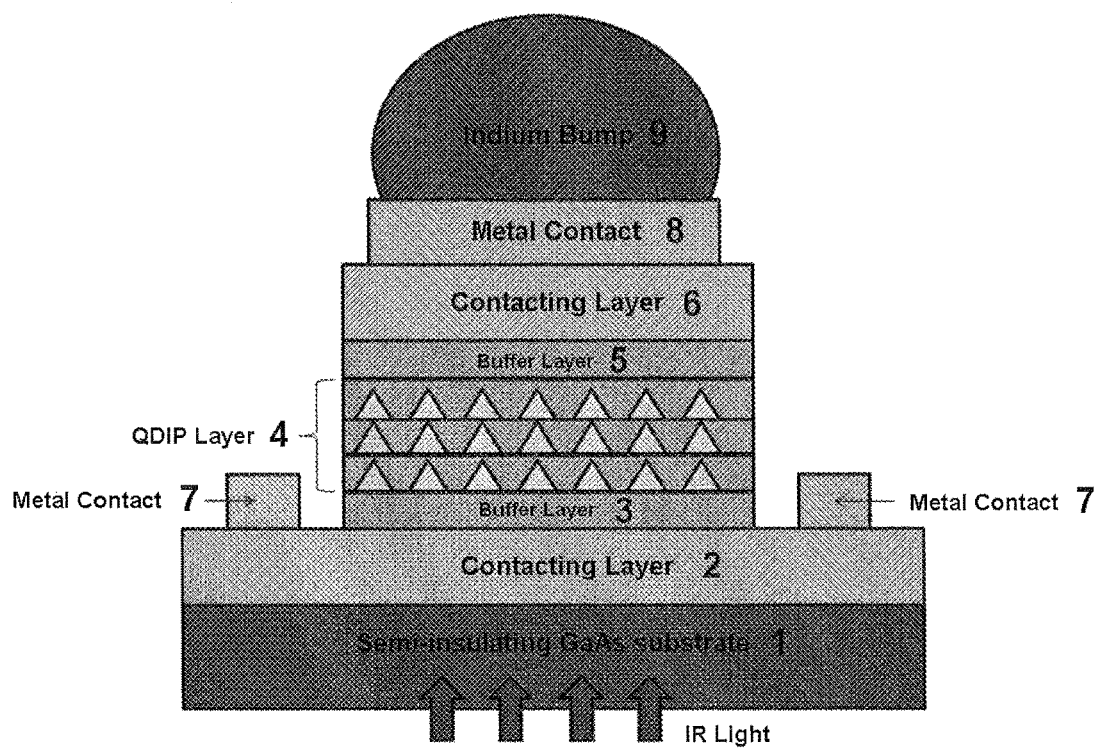
FIG. 2 shows a standard QDIP structure cross-section.

The standard FPA fabrication starts from MBE growth wafer as in FIG. 1. The brief fabrication process is explained here. In one embodiment, a MBE growth wafer is fabricated into FPA by standard photo-lithography, wet etching procedures, E-beam metal evaporation deposition, lift-off process, thermal annealing, and Indium bump deposition. FIG. 1 shows the semi-insulating GaAs substrate 1 upon which the first contacting layer 2 is deposited. Upon the first contacting layer 2 a first buffer layer 3 is also deposited. Directly above the first buffer layer 3, the QDIP layer 4 resides. Above the QDIP layer 4 is the second buffer layer 5. Above the second buffer layer 5 is the second contacting layer 6. FIG. 2 shows the finished structure of a regular QDIP. The finished structure includes the processed MBE growth wafter from FIG. 1 after wet etching processing which further includes a first set of metal contacts 7 attached to said first contacting layer 2, and the second metal contact 8 deposited upon said second contacting layer 6. Above the second metal contact 8 is an indium bump 9. In one embodiment, a wafer may then hybridized with a read out integration circuit (ROIC) 14 for image signal processing. IR light may shine from the bottom side (referred to as a backside illumination) to the detector since said ROIC 14 may be opaque.

Recently, surface plasmon polaritons (SPP) on thin film metallic hole array 13 has been studied extensively because of its ability to enhance the near-field of electromagnetic wave that pass through it. With a careful design of geometry on the metallic hole array and the correct metal type, one may couple SPP into the surface between metal and surrounding media. One can also control SPP properties such as wavelength that propagate along surface and its bandwidth. Research has demonstrated an enhancement of photocurrent and photo responsivity on SPP QDIP on single mesa [12]. Over 100% enhancement is achieved at specific wavelength, 8.5 µm. Other researchers also report enhancement on SPP QDIP [18, 24].

Figure 3:
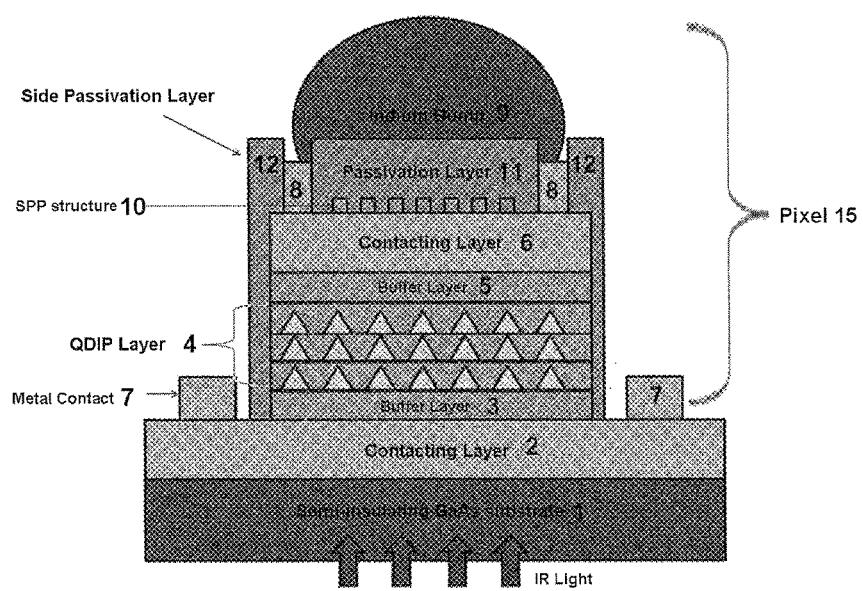
FIG. 3 shows a cross-section of one embodiment of the current invention QDIP structure.
Figure 4:
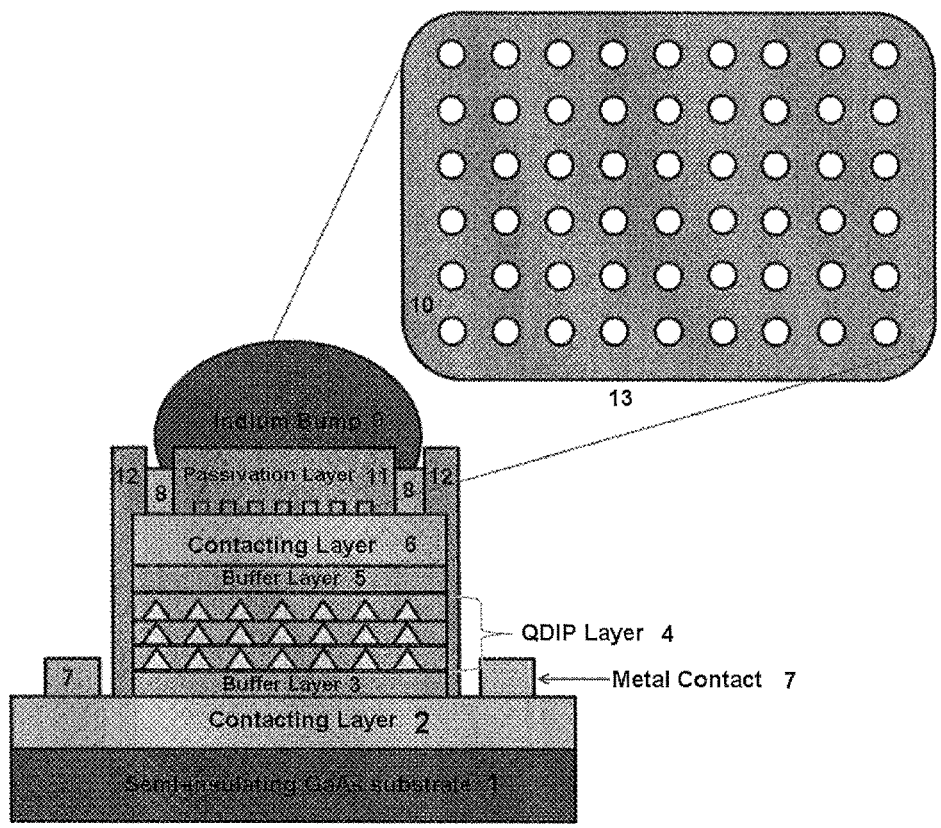
FIG. 4 shows the SPP structure (Top View) in addition to a cross-section of the larger structure.

In one embodiment, FIG. 3 shows one embodiment of the current invention QDIP structure. In one embodiment, a purpose of the design is to add a SPP structure 10 on top of QDIP structure 4 to create a SPP wave along the metal/dielectric interface. In one embodiment, a passivation layer (11 and 12) is deposited on top of SPP structure 11 and FPA sidewall 12 for two advantages. First advantage is to separate SPP structure 10 from Indium bump 9, which allows SPP wave on both sides of metal. The presence of a passivation layer (in one embodiment, Silicon Nitride, $SiN_x$) may help to maximize the resonance of SPP 10 thus increase enhancement further [25]. The second advantage is to reduce the surface dark current on FPA [14]. In one embodiment, FIG. 4 shows a physical SPP structure 10, a metallic hole array is made, in one embodiment, by gold with 75 nm thicknesses. The hole diameter may be 1.3 µm and the period may be 2.6 µm.

The preliminary results show a strong enhancement of photocurrent on Fourier Transform Infrared Spectroscopy (FTIR) test in all five bias voltages. The results show two strong enhancement peaks, at 8.5 µm and 5.9 µm, and may indicate the multispectral enhancement. Following is brief description of the report. First, sixteen single mesas are fabricated by standard photo-lithography. The mesa shape is cylindrical with 250 µm diameter. Then SPP structure are deposited on eight single mesas called SP mesa, leave the other eight bare mesa called bare mesa. Finally, the SP mesas and bare mesas are tested simultaneously to compare the performance.

There are several novel aspects of the invention and improvements upon prior art. The presence of a SPP structure may increase photocurrent on a detector. Therefore, it may improve detector performance. The design of SPP structure may also offer multispectral sensing application. The passivation layer may decrease surface dark current on the sidewall of the pixels of the FPA. Reducing dark current may increase the detectivity thus improving an overall performance of the detector. The backside configured plasmonic structure may significantly reduce the difficultness to make an image array and thus greatly reduces the cost.

DEVELOPMENT OF THE INVENTION

Herein an innovative design of quantum dot infrared photodetector (QDIP) for focal plane array with the assistance of surface plasmon structure and silicon nitride ($SiN_x$) passivation layer is presented. In one embodiment, QDIP performance as measured by a photocurrent spectrum response is enhanced by sixteen times. Both analytical expression and experimental result support the existence of surface plasmon polaritons. Even though the experimental data are based on QD infrared detectors, in one embodiment, the invention can be used for any kind of detectors and FPAs for performance enhancement. The innovation design for focal plane array is discussed in greater detail below.

Quantum dot infrared photodetectors (QDIP) have been developed over the last twenty years. The infrared detection and imaging in the long wave infrared (LWIR) have been used in many applications such as missile tracking, night vision imaging and thermal sensing [21, 22, 26, 27]. In order to compete with state of the art, which is Mercury Cadmium Telluride detector (MCT); QDIP needed to improve its overall performance. There may be two possible solutions, the first is to increase photocurrent and the second is to decrease dark current.

Surface plasmon polaritons have drawn the attention of scientists and researchers in the past few years [28-36], including, but not limited to, detector and sensor fields [37-45]. Surface plasmon structures have been applied onto QDIP to enhance the photocurrent. The strong electromagnetic field on metal/dielectric interface induces the photon absorption which leads to increasing photocurrent [24, 46-48]. However, the numbers of reports are still limited and the performance enhancement has yet to be improved.

Recently, a monolithically integrated plasmonic infrared quantum dot camera had also demonstrated [49]. The surface plasmon structure was integrated on the back side of substrate by interferometric lithography technique. However, fabrication technique is rather complicated and expensive for industrial production. The performance enhancement, as well, has yet to be improved.

In one embodiment, a back-side configured surface plasmon enhanced quantum dot infrared photodetector with a surface plasmon structure and $SiN_x$ passivation is used in order to increase the photocurrent and decrease the dark current. Standard photolithography is usually used for the fabrication process, which eliminates the complication of fabrication process and reduces fabrication cost together with processing time.

Sample Growth and Device Fabrication

Figure 5:
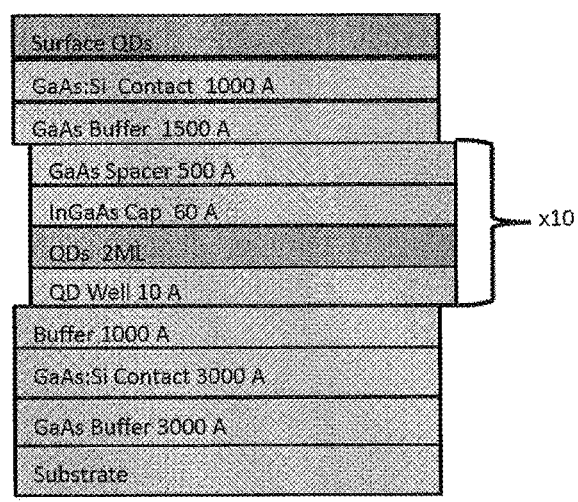
FIG. 5 shows a cross-section of the UML273 MBE Growth Structure.

The QDIP (UML273) may be grown by molecular beam epitaxy (MBE) using a V80H MBE system. A 0.3 µm Si-doped(n+) GaAs contact layer (n=1×10$^{18}$ cm$^{-3}$) may be first grown on a semi-insulating GaAs (100) wafer. The growth temperature for the GaAs contact and buffer layers is 620° C. The active absorption region includes, but is not limited to, ten periods of QD heterostructures consists of 1 nm $In_{0.15}Ga_{0.85}As$ followed by 2.0 monolayer (ML) of InAs, 30 ML of $In_{0.20}Ga_{0.80}As$ cap layer, and 50 nm GaAs spacer layer. The growth rates of the InAs QDs, $In_{0.20}Ga_{0.80}As$ cap layers, and GaAs spacers were 0.16, 0.8, and 0.9 ML/s, respectively. The doping level of the QD region was estimated to be $3.5 \times 10^{17}$ cm$^{-3}$. The QD layers and the $In_{0.20}Ga_{0.80}As$ cap layers were grown at 470° C. The top contact layer may be highly Si-doped (n=1×10$^{18}$ cm$^{-3}$) GaAs with a thickness of 0.1 µm. FIG. 5 shows the structure of the UML273 sample.

After the growth of the layers described above, the wafer was processed into 250 µm diameter circular mesas using standard photolithography and wet etching procedures. The top and bottom electrodes were formed simultaneously on top and surrounding of the mesas by standard e-beam metal evaporation deposition, lift-off, and thermal annealing processes. The QDTP was then wire-bonded and mounted on a cold finger inside a temperature-controllable infrared (IR) dewar with a ZnSe IR window. The photocurrent spectrum of the QDIP was measured using a Bruker Optics Tensor27 FTIR spectrometer.

Two-Dimensional (2D) Subwavelength Hole Array (2DSHA) on QDIP

Figure 6:
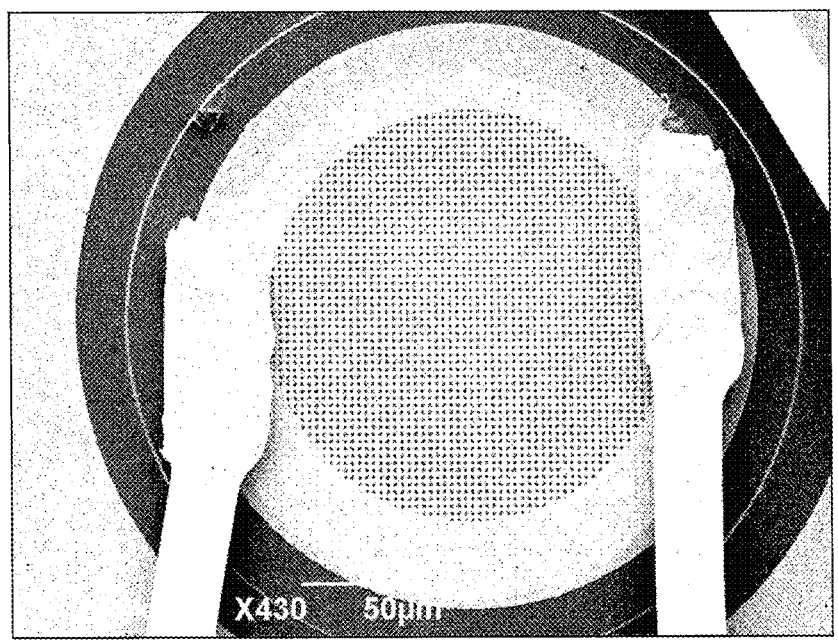
FIG. 6 shows a topside view of the UML273-SP (SEM@430× magnification).
Figure 7:
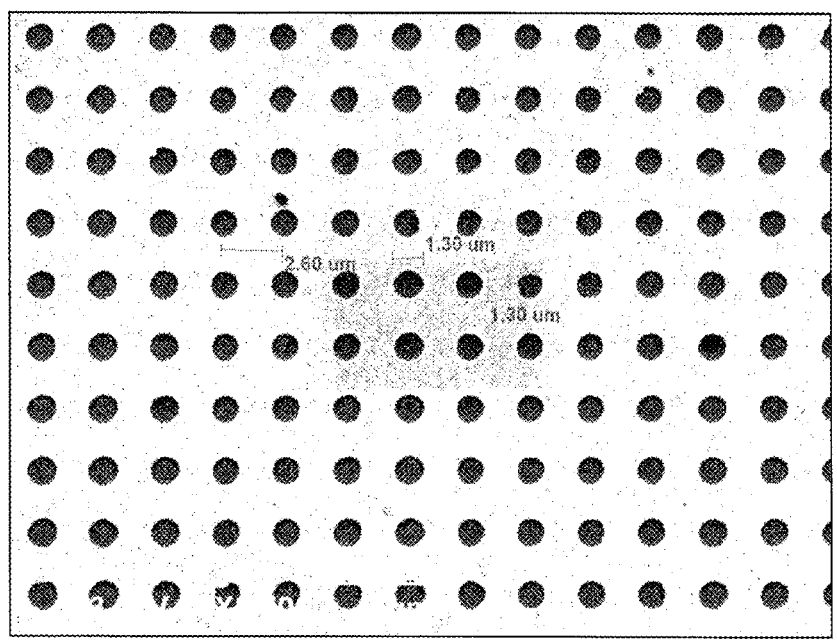
FIG. 7 shows a topside view of the UML273-SP (SEM@3700× magnification).
Figure 8:
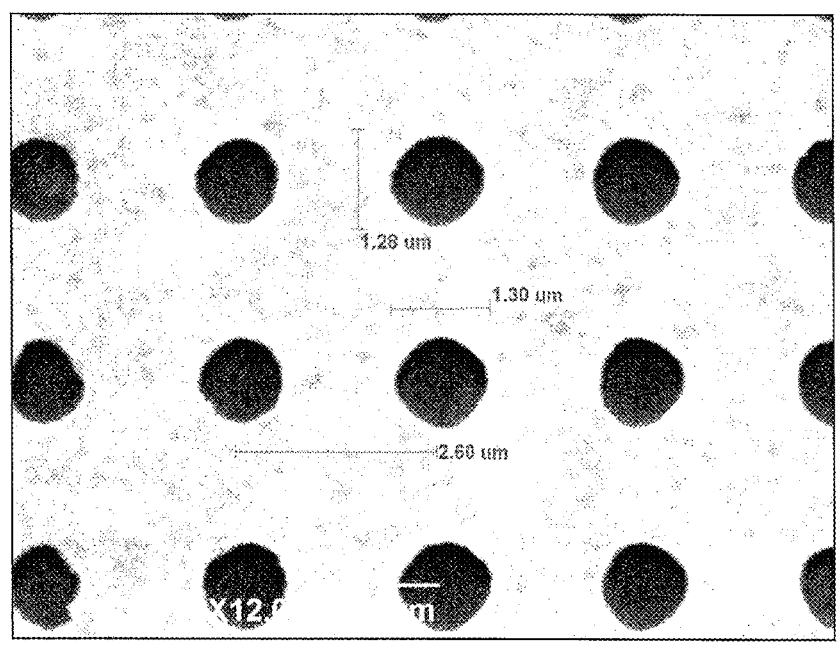
FIG. 8 shows a topside view of the UML273-SP (SEM@12000× magnification).

Afterward, surface plasmon structure of 2.6-1.3 µm on top surface of the QDIP was fabricated with standard lithography. The metal thickness was optimized for the performance enhancement. In one embodiment, it was found that for the surface plasmon structure, the gold thickness of 75 nm have the maximum performance [50]. In one embodiment, each of the plasmonics sample has bare detector that stands side by side used for reference purpose. Both plasmonics sample and reference sample are tested in controlled environment and compared for the enhancement. FIG. 6, FIG. 7, and FIG. 8 are the SEM pictures of plasmonics structure on QDIP.

$SiN_x$ Deposition and Etching on QDIP

There are several types of passivation layers, such as $Si_3N_4$, $SiO_2$ and polyimide (PI), that may benefit electrical devices. The potential benefits of each of these passivation layer types have been compared and reported. It has been shown, both theoretically and experimentally, that $Si_3N_4$ with a thick thickness may be most suitable to use as a passivation layer compared to $SiO_2$ on InP for multi-quantum well Fabry-Perot laser structure [51]. One of the reports also indicate that $Si_3N_4$ and PI outperform $SiO_2$ on reducing the leakage current on photodiodes [52]. On an Avalanche photodiode based on GaAs, $Si_3N_4$ passivation was more effective than a PI passivation in restricting the surface current. $Si_3N_4$ passivation has a lower Generation-Recombination (G-R) current and a surface carrier concentration than PI passivation [53, 54]. On the bipolar transistors, $Si_3N_4$ passivation also improved the reduction of surface recombination [55, 56]. On GaAs metal semiconductor field effect transistors (MESFETs), $Si_3N_4$ passivation proved to have a better reliability compared to $SiO_2$ passivation [57]. Another advantage of $Si_3N_4$ passivation on the device is to prevent environmentally induced degradation and surface current reduction. Most of the reports used a plasma-enhanced chemical vapor deposition (PECVD) system to deposit $SiN_x$ passivation layer on the material.

In one embodiment of the current invention, the $SiN_x$ passivation layer was applied on top and sidewall of the sample for two possible advantages. The first advantage may be to separate surface plasmon structure from Indium bump which allows surface plasmon wave on both sides of metal. The passivation layer helps to maximize the resonance of surface plasmon wave thus increase enhancement further [25]. Compared to the back side surface plasmon structure [49], the presence of surface plasmon structure on top of the mesa may also reduce the cross interference of surface plasmon wave between adjacent mesa since the surface plasmon structure was separated apart in each mesa. The second advantage may be to reduce the surface dark current on FPA side wall [14]. FIG. 2 shows a standard FPA design for the commercial application and FIG. 3 shows one embodiment of the current invention, a pixel 15 of the FPA design.

Before $SiN_x$ deposition, the QDIP sample was polished on the backside in order to be tested for backside illumination. The backside polishing on reference GaAs wafer has been tested and it was found the transmission through the wafer is consistent over 94% transmission in comparison with the commercial double side polishing GaAs sample (mirror-finished grade). $SiN_x$ was then deposited on the wafer by plasma-enhanced chemical vapor deposition (PECVD) machine (Nexx PECVD, Cirrus 150) with the thickness of 0.4 µm. One embodiment of the deposition recipe is found in Table 1 (PECVD $Si_3N_4$ Deposition Recipe). After deposition, the wafer was spin coated with photoresist and soft baked. The metal-deposition mask may be used again to align the wafer and the mask may be exposed so the photoresist had an opening area of the metal structure. Next, reactive ion etching (Nexx RIE, Cirrus 150) was applied to etch $SiN_x$ down to reach the metal layer. One embodiment of the RIE Etching recipe is on Table 2 (RIE $Si_3N_4$ Etching Recipe).

TABLE 1

PECVD $Si_3N_4$ Deposition Recipe

| | |
|---|---|
| Ar (sccm) | 20 |
| $N_2$ (sccm) | 11.6 |
| 3% $SiH_4$(sccm) | 110 |
| Process Pressure (mTorr) | 20 |
| Microwave Power (W) | 265 |
| RF Power (W) | 0 |
| He Backside Cooling (Torr) | 5 |
| Deposition Time (sec) | 1600 |
| Deposition Rate (A°/sec) | 2.57 |

TABLE 2

RIE $Si_3N_4$ Etching Recipe.

| | |
|---|---|
| Ar (sccm) | 10 |
| $CF_4$ (sccm) | 15 |
| Process Pressure (mTorr) | 10 |
| Microwave Power (W) | 300 |
| RF Power (W) | 100 |
| He Backside Cooling (Torr) | 5 |
| Process Time (sec) | 145 |

Device Performance Characterization and Discussion

For surface plasmon polaritons on a metallic thin film, the wavelengths of the excited surface plasmon modes at normal incidence can be expressed as in Equation 1 found below [31].

$$\lambda_{ij} = \frac{a_0}{\sqrt{i^2 + j^2}} \sqrt{\frac{\varepsilon_m \varepsilon_d}{\varepsilon_m + \varepsilon_d}} \quad \text{Equation 1}$$

where $a_0$ is the period of periodic hole array on metal thin film, i and j are integers, $\varepsilon_m$ is dielectric constant of metal, $\varepsilon_d$ is dielectric constant of surrounding medium.

One can achieve the wavelength of surface plasmon polaritons by designing the period of holes array on metal thin film. In the visible regime, several experimental and simulation results have been reported on the enhancement of transmission on holes array metallic thin film [25, 58-60]. In infrared regime, the formula on Equation 1 is still applicable with a substantial change on $\varepsilon_m$.

Figure 9:
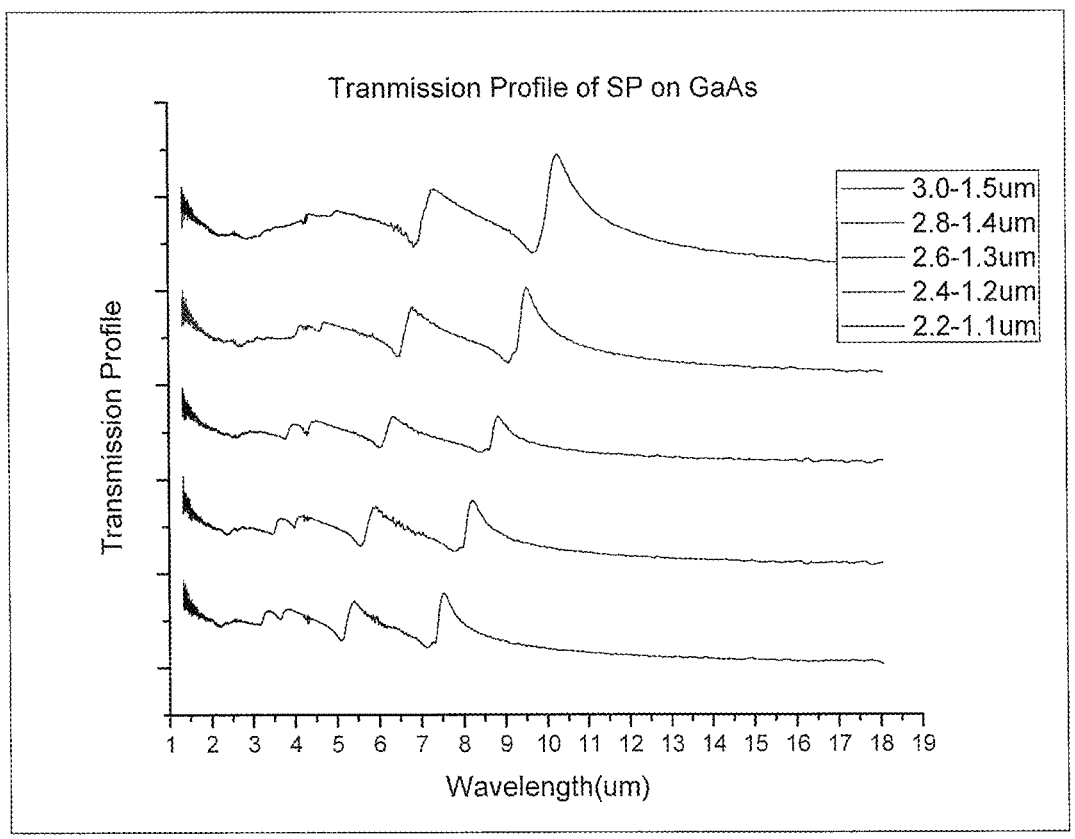
FIG. 9 shows a transmission profile of surface plasmon structure on GaAs.

The surface plasmon structure was first fabricated on a commercial double side polished bare GaAs wafer and tested the transmission profile on each period. FIG. 9 shows the transmission profile of surface plasmon structure for different period. The plasmonic structures are fabricated by standard lithography on GaAs wafer with gold thickness of 25 nm. The results show the transmission profile of two-dimensional subwavelength hole array (2DSHA) from the period of 2.2 µm up to 3.0 µm. On the label in FIG. 9, the front number indicates period and the following number indicates circular hole size diameter. The physical geometry of 2DSHA is similar as FIG. 6, FIG. 7, and FIG. 8, except the 2DSHA is on double side polished bare GaAs wafer. All samples have 50% filling factor.

Each transmission profile on FIG. 9 displays two obvious peaks corresponding to surface plasmon modes in Equation 1. As an example, $\varepsilon_d$ is equal to 10.89 for GaAs. $\varepsilon_m$ is approximately equal to $-5050+1090i$ for gold at wavelength of 10 µm [61]. For the calculated surface plasmon mode with the 3.0 µm period, $\lambda_{01}=\lambda_{10}=9.91$ µm, $\lambda_{11}=7.0$ µm. For the period of 2.6 µm, $\varepsilon_m$ is approximately equal to $-2507.5+i1059.9$ for gold at wavelength of 8.8 µm and $\varepsilon_d$ is equal to 10.89 for GaAs. The calculated wavelength are $\lambda_{01}=\lambda_{10}=8.60$ µm, $\lambda_{11}=6.08$ µm.

Figure 10:
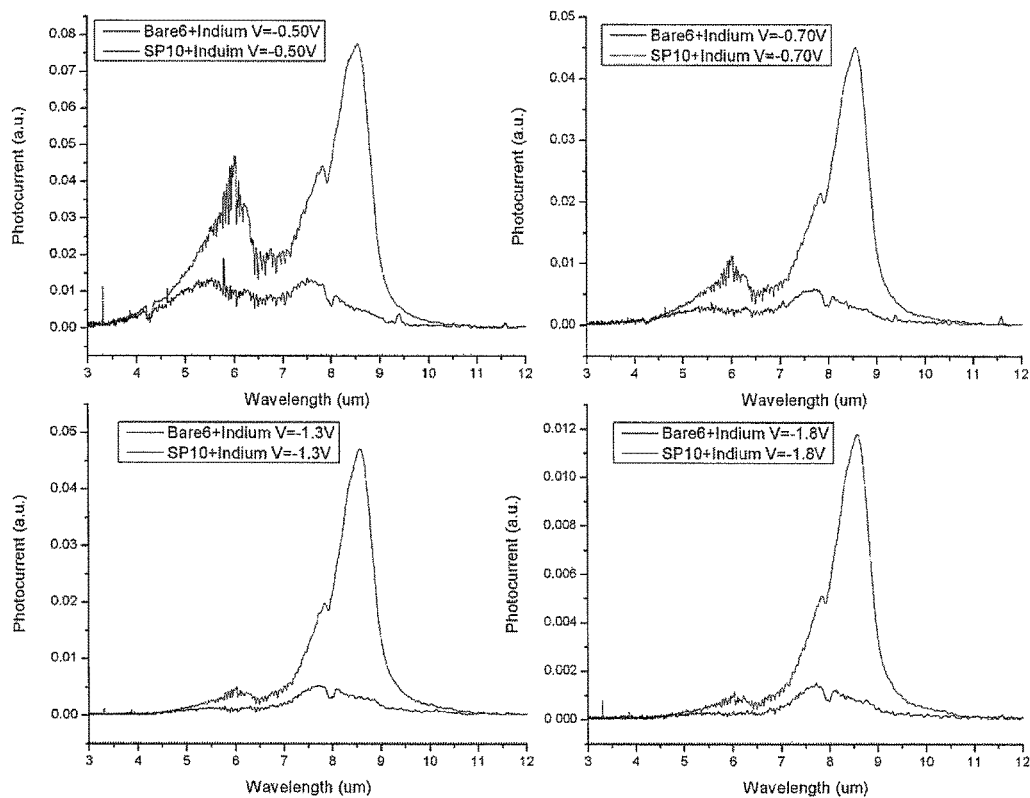
FIG. 10 shows photocurrent spectrum of QDIP versus QDIP-SP.

Herein, the period of the surface plasmon structure at 2.6 µm was selected to match the QDIP spectrum response. The gold thickness on surface plasmon structure was optimized and it was found that the maximum photocurrent corresponds to the metal thickness of 75 nm [50]. In FIG. 10, the black color lines show the spectrum response of the current QDIP sample with Indium bump deposition on top of the mesa. The QDIP sample was polished on the backside and illuminated from the backside. The spectrum response for the current QDIP sample is from 4 µm to 10 µm. The peak of transmission profile on FIG. 9 and the analytical expression on Equation 1 confirm the essence of surface plasmon generation on the surface of metal/dielectric medium.

Figure 11:
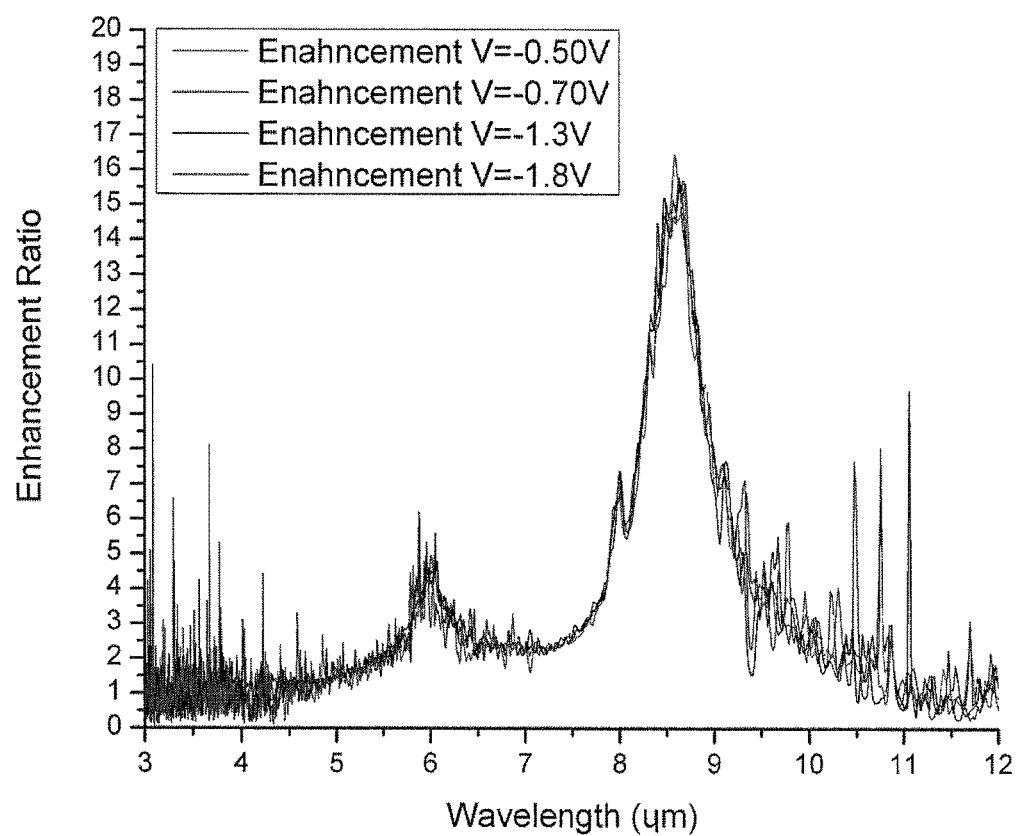
FIG. 11 shows the enhancement ratio.
Figure 12:
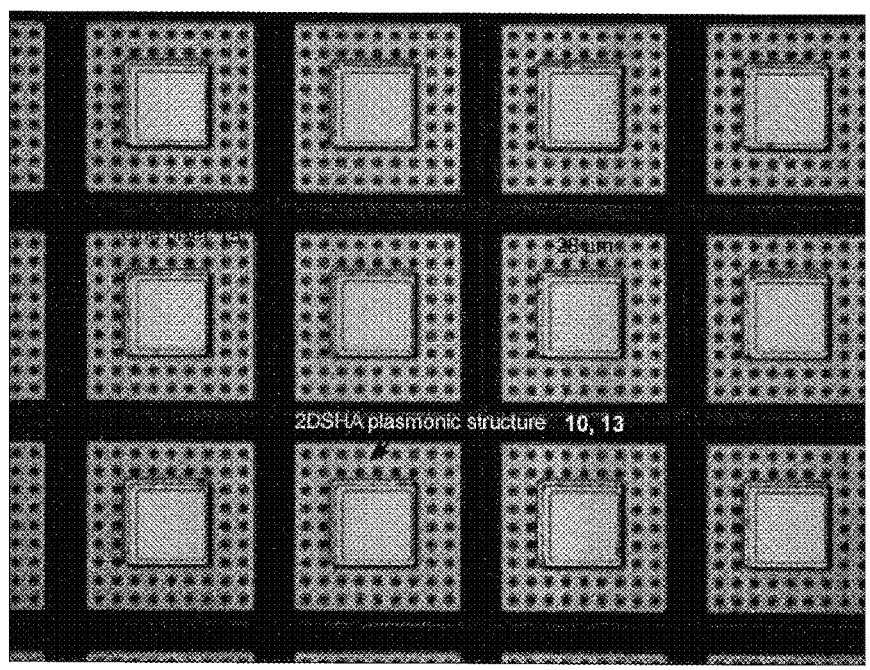
FIG. 12 shows a topside picture of the part (4×3 pixels of the 640×512) plasmonic FPA. The small holes are the plasmonic structures.
Figure 13:
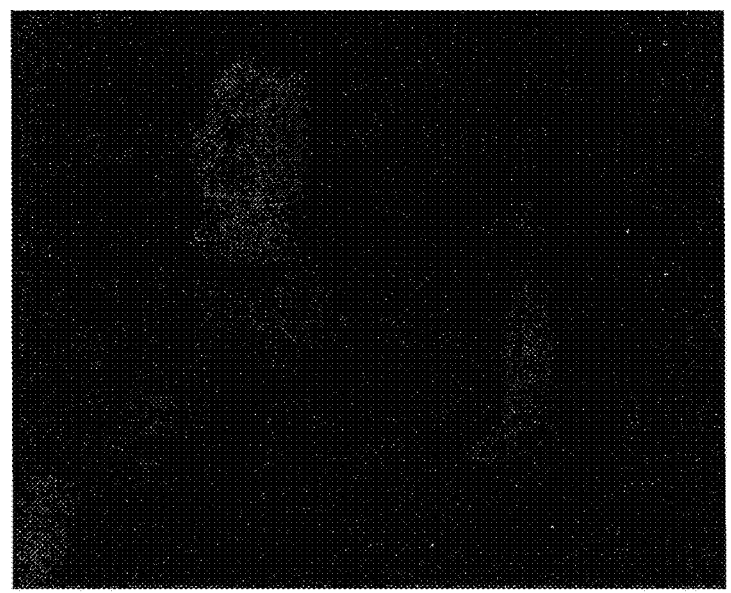
FIG. 13 shows an infrared image obtained by the plasmonic FPA. The working temperature was increased from 77K to 120K, which is over 40K. This is the highest working temperature obtained so far for the longwave infrared FPA.

FIG. 10 exhibits the spectrum response of QDIP-SP sample and QDIP-ref sample (QDIP-reference sample). The QDIP-SP (red color lines) indicate a significant enhancement in every applied bias voltage compared with QDIP-ref (black color lines). The spectrum response of four biases, V=−0.5V, V=−0.7V, V=−1.3V, and V=−1.8V was demonstrated. The spectrum response ranges from 4 μm to 10 μm in all biases. The low voltage bias has a tendency to pick up stronger in shorter wavelengths (3-7 μm) due to quantum-confined Stark effect. The QDIP-SP sample has two peaks on spectrum response, one is at 8.8 μm and the other is 6.1 μm. At the voltage bias V=−0.5V, the QDIP-ref spectrum response is roughly in the same level. But QDIP-SP spectrum response has stronger first peak than the second peak. This means that the surface plasmon wave generation efficiency for the first mode may be higher than that of second mode. FIG. 11 also suggests that first mode efficiency may be higher than the second mode efficiency. The surface plasmon generation efficiency can be related to the imaginary part of the surface plasmon polaritons wave vector ($k_{spp}$). The greater imaginary part, the more internal damping thus more loss it will be. For wavelength 6.1 μm, $\varepsilon_m$ is approximately equal to −1320+382i. For wavelength 8.8 μm, $\varepsilon_m$ is approximately equal to −2420+1030i. Surface plasmon momentum wave vector ($k_{spp}$) is expressed in Equation 2 found below [62, 63]. Providing $$k_o = \frac{w}{c},$$

one can calculate $k_{spp}$. The result is the following, $k_{spp\text{-}6.1\ \mu m}=k_0(3.3264+0.0037i)$ and $k_{app\text{-}8.8\ \mu m}=k_{=0}(3.3200+0.0027i)$. The imaginary part for 8.8 μm is less than the one for 6.1 μm, which suggests less loss on the surface plasmon polaritons wave and therefore leads to greater performance enhancement on the spectrum response.

$$k_{SPP} = k_0 \sqrt{\frac{\varepsilon_m * \varepsilon_d}{\varepsilon_m + \varepsilon_d}} \qquad \text{Equation 2}$$

FIG. 11 shows the enhancement ratio of spectrum response between QDIP-SP and QDIP-ref. Four bias voltages were tested and it was found the enhancement ratio are consistent in all bias voltages from V=−0.5V to V=−1.8V. There are two peaks of enhancement. The first peak of enhancement ratio is located at 8.8 μm wavelength which corresponds to mode 01 ($\lambda_{01}$=8.60 μm) of the surface plasmon generation on the metal/dielectric surface. The second peak of enhancement ratio is also corresponds to mode 11 ($\lambda_{11}$=6.08 μm). The significant enhancement ratio at sixteen times is reported at 8.6 μm wavelength for mode 01. The enhancement ratio at four times is also reported at 6.1 μm wavelength for mode 11. Note here that two wavelengths of enhancement depend on the period of the surface plasmon structure as stated in Equation 1. Multicolor enhancement selection has been reported depending on polarization selection by a designed surface plasmon structure [64].

In addition to the enhancement result of sixteen times and four times at 8.6 μm and 6.1 μm, it is believed that the surface plasmon structure on top of mesa and $SiN_x$ passivation layer between surface plasmon structure and Indium deposition offers several advantages on the infrared focal plane array and imaging array. First, all fabrication are carried out on the top side of the sample. This will reduce time consumed in the fabrication process compared to fabrication of surface plasmon structure on the back side of the sample. Moreover, the distance between the top side surface plasmon structure and quantum dot absorption layer is closer than the back side's one due to the limitation of the polishing process and the standard design of thicker n$^+$ GaAs contact layer on the bottom electrode. Therefore, the effect of surface plasmon generation is exponentially stronger with a top side surface plasmon structure than a back side surface plasmon structure. The second advantage is related to the cross talk of surface plasmon wave on the metal/dielectric interface. The location of each mesa on focal plane array may be very close to each other, in fact approximately a few microns in distance. A surface plasmon wave from the backside structure generated on one mesa can travel along the metal/dielectric interface and affect the adjacent mesas as long as the metal/dielectric interface is connected. As a result, the cross talk signal is introduced on the back side surface plasmon structure. The smaller distance from one mesa to each other, the stronger cross talk signal interferes with the correct signal. For the current invention design, the surface plasmon structure on top of each mesa is isolated from all adjacent mesas. So, the cross talk from surface plasmon wave will not be generated. The quality of the picture would be better compared with the backside surface plasmon structure. The third advantages may come from the $SiN_x$ passivation layer. A $SiN_x$ passivation layer will reduce overall dark current since it reduces the surface dark current on the side wall. The effect of dark current reduction may be signified with the smaller mesa size on focal plane array due to the geometry of the surface and volume on the mesa. The reduction of dark current from $SiN_x$ passivation layer may benefit the detectivity of the detector and hence improves its performance. Indium bump on top of $SiN_x$ passivation layer may also reflect the light back to the sample, which may lead to stronger surface plasmon wave generation. With the combination of all three advantages from the invention's current design and the maximum enhancement ratio of sixteen times, the development of imaging array and infrared photodetector has been improved to offer greater performance and better image quality.

The performance enhancement may also be improved by reducing the separation distance between the quantum dot absorption layer and surface plasmon structure. With the top side surface plasmon structure design, it may be more convenient to thinner the top n$^+$ GaAs contact layer due to non-etching process on the top electrode. GaAs spacer layer and buffer layer could also be re-designed to reduce the separation distance.

In summary, a QDIP with surface plasmon structure with significant enhancement of sixteen times at particular wavelength has been demonstrated. The wavelength of enhancement may be designed by geometry of surface plasmon structure to match QDIP spectrum response. It began with the transmission profile of surface plasmon structure on GaAs. Then surface plasmon structure on the QDIP was integrated. With an assistance of $SiN_x$ passivation layer in between surface plasmon structure and Indium bump on top of the detector, the performance enhancement of sixteen times on the first mode and four times on second mode of plasmonic wave generation as achieved.

More importantly, the innovative QDIP-FPA with surface plasmon structure for optimizing the imaging array performance has been outlined. The result in single mesa may be a validation of the new FPA approach. This FPA design resolves a complexity of fabrication process in QDIP-FPA with surface plasmon structure, offers a cost and time reduction on FPA fabrication process, and improve the detector performance by applying surface plasmon structure in conjunction with $SiN_x$ passivation. This FPA design together with the enhancement result may significantly impact the manufacturing of infrared photodetectors.

Although the invention has been described with reference to these preferred embodiments, other embodiments can achieve the same results. Variations and modifications of the present invention will be obvious to those skilled in the art and it is intended to cover in the appended claims all such modifications and equivalents. The entire disclosures of all applications, patents, and publications cited above, and of the corresponding application are hereby incorporated by reference.

One Example of Fabrication Steps
1. Form the two dimensional hole array (2DHA) plasmonic structure using photolithography upon the layered QDIP structure, then deposit the metal (optimally 75 nm gold), and lift-off to finish the patterning.
2. Pattern the mesa using photolithography, then wet etch using a piranha etch (sulfuric acid, hydrogen peroxide, water), stopping the etch at the bottom contact layer.
3. Pattern the ohmic contacts, on the top of the pixels and the ground ring, using photolithography, then deposit Ni(50 Å)/Ge(170 Å)/Au(330 Å)/Ni(150 Å)/Au(3000 Å) and lift off to finish the ohmic contacts.
4. Use rapid thermal annealing in a nitrogen environment to form the ohmic contacts.
5. Deposit 400 nm of low stress $Si_3N_4$ for passivation and to protect the 2DHA from the indium.
6. Open a via to the ohmic contact metal using an inductively coupled plasma reactive ion etch (ICPRIE) system.
7. Use photolithography to pattern the indium bumps, then deposit Cr (150 Å)/In (5 µm) and lift-off to finish the indium bump step.
8. Hybridize to read out integration circuit (ROIC).

Figure 14:
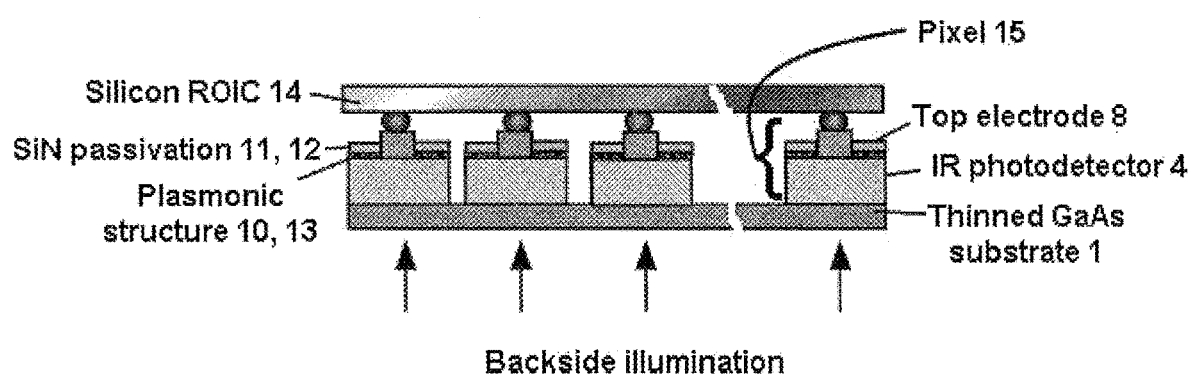
FIG. 14 shows a side view schematic structure of the back-side configured plasmonic polariton structure enhanced FPA. The plasmonic polariton structures are configured on the other side of the substrate. The light incident is from the front side of the substrate. Four individual pixels are shown in FIG. 14.

An example of a product produced by such a process is seen in FIG. 14.

REFERENCES

1. Liu, H. C. (2003) "Quantum dot infrared photodetector," *Opto-Electron. Rev.* 11(1), 1-5.
2. Kim, E.-T. et al. (2004) "High detectivity InAs quantum-dot infrared photodetectors," *Appl. Phys. Lett.* 84, 3277-3279.
3. Tsao, S. et al. (2007) "High operating temperature 320×256 middle-wavelength infrared focal plane array imaging based on an InAs/InGaAs/InAlAs/InP quantum dot infrared photodetector," *Appl. Phys. Lett.* 90(20), 201109.
4. Bhattacharya, P. et al. (2005) "Characteristics of a tunneling quantum-dot infrared photodetector operating at room temperature," *Appl. Phys. Lett.* 86, 191106.
5. Jiang, L. et al. (2003) "In0.6Ga0.4As/GaAs quantum-dot infrared photodetector with operating temperature up to 260 K," *Appl. Phys. Lett.* 82, 1986-1988.
6. Krishna, S. et al. (2007) "Quantum Dot Based Infrared Focal Plane Arrays," *Proceedings of the IEEE* 95(9), 1838-1852.
7. Gunapala, S. et al. (2007) "640×512 Pixels long-wavelength infrared (LWIR) quantum-dot infrared photodetector (QDIP) imaging focal plane array," *IEEE J. Quantum Electron.* 43(3), 230-237.
8. Lu, X. et al. (2007) "Temperature-dependent photoresponsivity and high-temperature (190 K) operation of a quantum dot infrared photodetector," *Appl. Phys. Lett.* 91(5), 051115.
9. Chakrabarti, S. et al. (2004) "High-Temperature Operation of InAs—GaAs Quantum-Dot Infrared Photodetectors With Large Responsivity and Detectivity," *IEEE Photonic. Tech. L.* 16, 1361-1363.
10. Lim, H. et al. (2007) "High-performance InAs quantum-dot infrared photodetectors grown on InP substrate operating at room temperature," *Appl. Phys. Lett.* 90, 131112.
11. Vaillancourt, J. et al. (2011) "High Operating Temperature (Hot) Middle Wave Infrared (MWIR) Quantum-Dot Photodetector," *Optics Photonic. L.* 4(2), 57-61.
12. Vasinajindakaw, P. et al. (2011) "A Fano-type interference enhanced quantum dot infrared photodetector," *Appl. Phys. Lett.* 98(21), 211111.
13. Rogalski, A. (2012) "Progress in focal plane array technologies," *Prog. Quant. Electron.* 36(2-3), 342-473.
14. Vasinajindakaw, P. (2009) "Verification and Reduction of Dark Current on Quantum Dot Infrared photodetector," in *Electrical & Computer Engineering*, University of Massachusetts at Lowell, Lowell.
15. Krishna, S. (2011) "Quantum Dot Focal Plane Array with Plasmonic Resonator," *Proc. SPIE-Int. Soc. Opt. Eng.* 8095, 809506.
16. Eker, S. U. et al. (2008) "Large-Format Voltage-Tunable Dual-Band Quantum-Well Infrared Photodetector Focal Plane Array for Third-Generation Thermal Imagers," *IEEE Electron Device Lett.* 29(10), 1121-1123.
17. Li, X. (2010) "Dark current characterization and analysis of long wavelength infrared photodetectors based on type-II quantum dots," in *Department of Nanoelectronics*, Acreo, Stockholm, Sweden.
18. Lee, S. C. et al. (2011) "Plasmonic-Enhanced Photodetectors for Focal Plane Arrays," *IEEE Photonic. Tech. L.* 23(14), 935-937.
19. Koch, F. E. et al. "Quantum dot infrared photodetector focal plane array," U.S. Pat. No. 6,906,326, application Ser. No. 10/627,460, filed Jul. 25, 2003. (issued Jun. 14, 2005).
20. Lee, S. C. et al. (2010) "Light direction-dependent plasmonic enhancement in quantum dot infrared photodetectors," *Appl. Phys. Lett.* 97(2), 021112-021113.
21. Tidrow, M. Z. (2000) "Device physics and state-of-the-art of quantum well infrared photodetectors and arrays," *Mater. Sci. Eng. B* 74(1-3), 45-51.
22. Xudong, J. et al. (1999) "Investigation of a multistack voltage-tunable four-color quantum-well infrared photodetector for mid- and long-wavelength infrared detection," *IEEE J. Quantum Electron.* 35(11), 1685-1692.
23. Levine, B. F. (1993) "Quantum-well infrared photodetector," *J. Appl. Phys.* 74(8), R1-R81.
24. Lee, S. C. et al. (2009) "Quantum dot infrared photodetector enhanced by surface plasma wave excitation," *Opt. Express* 17(25), 23160-23168.
25. Krishnan, A. et al. (2001) "Evanescently coupled resonance in surface plasmon enhanced transmission," *Opt. Commun.* 200(1-6), 1-7.
26. Stiff-Roberts, A. D. (2009) "Quantum-dot infrared photodetectors: a review," *J. Nanophoton.* 3, 031607-031617.
27. Bhattacharya, P. et al. (2004) "Quantum Dot Opto-Electronic Devices," *Annu. Rev. Mater. Res.* 34(1), 1-40.

28. Ebbesen, T. W. et al. (1998) "Extraordinary optical transmission through sub-wavelength hole arrays," *Nature* 391(6668), 667-669.
29. Ghaemi, H. F. et al. (1998) "Surface plasmons enhance optical transmission through subwavelength holes," *Phys. Rev. B* 58(11), 6779-6782.
30. Matsui, T. et al. (2007) "Transmission resonances through aperiodic arrays of subwavelength apertures," *Nature* 446(7135), 517-521.
31. Salomon, L. et al. (2001) "Near-Field Distribution of Optical Transmission of Periodic Subwavelength Holes in a Metal Film," *Phys. Rev. Lett.* 86(6), 1110-1113.
32. Popov, E. et al. (2000) "Theory of light transmission through subwavelength periodic hole arrays," *Phys. Rev. B* 62(23), 16100-16108.
33. Maier, S. A. and Atwater, H. A. (2005) "Plasmonics: Localization and guiding of electromagnetic energy in metal/dielectric structures," *J. Appl. Phys.* 98(1), 011101-011110.
34. Parsons, J. et al. (2009) "Localized surface-plasmon resonances in periodic nondiffracting metallic nanoparticle and nanohole arrays," *Phys. Rev. B* 79(7), 073412.
35. Barnes, W. L. (2006) "Surface plasmon-polariton length scales: a route to sub-wavelength optics" *J. Opt. A: Pure Appl. Opt.* 8(4), S87-S93.
36. Murray, W. A. and Barnes, W. L. (2007) *"Plasmonic Materials," Adv. Mater.* 19(22), 3771-3782.
37. Atwater, H. A. and Polman, A. (2010) "Plasmonics for improved photovoltaic devices," *Nat. Mater.* 9(3), 205-213.
38. Ferry, V. E. et al. (2008) "Plasmonic Nanostructure Design for Efficient Light Coupling into Solar Cells," *Nano Lett.* 8(12), 4391-4397.
39. Ferry, V. E. et al. (2010) "Light trapping in ultrathin plasmonic solar cells," *Opt. Express* 18(S2), A237-A245.
40. Catchpole, K. R. and Polman, A. (2008) "Plasmonic solar cells," *Opt. Express* 16(26), 21793-21800.
41. Jestl, M. et al. (1989) "Polarization-sensitive surface plasmon Schottky detectors," *Opt. Lett.* 14(14), 719-721.
42. Liu, N. et al. (2010) "Infrared Perfect Absorber and Its Application As Plasmonic Sensor," *Nano Lett.* 10(7), 2342-2348.
43. Homola, J. et al. (1999) "Surface plasmon resonance sensors: review," *Sensors and Actuators B: Chemical* 54(1-2), 3-15.
44. Yu, N. et al. (2008) "Quantum cascade lasers with integrated plasmonic antenna-array collimators," *Opt. Express* 16(24), 19447-19461.
45. Vuckovic, J. et al. (2000) "Surface plasmon enhanced light-emitting diode," *IEEE J. Quantum Electron.* 36(10), 1131-1144.
46. Vasinajindakaw, P. et al. (2011) "A Fano-type interference enhanced quantum dot infrared photodetector," *Applied Physics Letters* 98(21), 211111-211111-21211113.
47. Chang, C.-C. et al. (2010) "A Surface Plasmon Enhanced Infrared Photodetector Based on InAs Quantum Dots," *Nano Lett.* 10(5), 1704-1709.
48. Chi-Yang, C. et al. (2007) "Wavelength selective quantum dot infrared photodetector with periodic metal hole arrays," *Appl. Phys. Lett.* 91(16), 163107.
49. Lee, S. J. et al. (2011) "A monolithically integrated plasmonic infrared quantum dot camera," *Nat. Commun.* 2, 286.
50. Vasinajindakaw, P. (2012) "Surface plasmon enhanced quantum dot infrared photodetector," in *Electrical & Computer Engineering*, p 70, University of Massachusetts at Lowell, Lowell.
51. Tan, C. L. et al. (2009) "$Si_3N_4/SiO_2$ passivation layer on InP for optimization of the 1.55 um MQW FP laser performance," in *Numerical Simulation of Optoelectronic Devices, 2009. NUSOD 2009. 9th International Conference on*, pp 91-92.
52. Lee, D. H. et al. (1988) "A study of the surface passivation on GaAs and $In_{0.53}Ga_{0.47}As$ Schottky-barrier photodiodes using $SiO_2$, $Si_3N_4$ and polyimide," *IEEE Trans. Electron Devices* 35(10), 1695-1696.
53. Song, H. J. et al. (2009) "Analysis of surface dark current dependent upon surface passivation in APD based on GaAs," *Semicond. Sci. Technol.* 24, 5.
54. Song, H. J. et al. (2009) "Comparative analysis of dark current between $SiN_x$ and polyimide surface passivation of an avalanche photodiode based on GaAs," *Semicond Sci. Technol.* 24, 5.
55. Jin, Z. et al. (2004) "Current gain increase by $SiN_x$ passivation in self-aligned InGaAs/InP heterostructure bipolar transistor with compositionally graded base," *Solid-State Electron.* 48(9), 1637-1641.
56. Jin, Z. et al. (2005) "Passivation of InP/GaAsSb/InP double heterostructure bipolar transistors with ultra thin base layer by low-temperature deposited $SiN_x$," *Solid-State Electron.* 49(3), 409-412.
57. Dumas, J. M. et al. (1985) "Comparative reliability study of GaAs power MESFETs: mechanisms for surface-induced degradation and a reliable solution," *Electron. Lett.* 21(3), 115-116.
58. Genet, C. and Ebbesen, T. W. (2007) "Light in tiny holes," *Nature* 445(7123), 39-46.
59. Coe, J. V. et al. (2008) "Extraordinary Transmission of Metal Films with Arrays of Subwavelength Holes," *Annu. Rev. Phys. Chem.* 59(1), 179-202.
60. Chang, S.-H. et al. (2005) "Surface plasmon generation and light transmission by isolated nanoholes and arrays of nanoholes in thin metal films," *Opt. Express* 13(8), 3150-3165.
61. Ordal, M. A. et al. (1983) "Optical properties of the metals Al, Co, Cu, Au, Fe, Pb, Ni, Pd, Pt, Ag, Ti, and W in the infrared and far infrared," *Appl. Opt.* 22(7), 1099-1119.
62. Raether, H. (1988) *Surface Plasmons on Smooth and Rough Surfaces and on Grateings*, Springer, Berlin.
63. Maier, S. A. (2007) "Plasmonics fundamentals and applications," Springer, New York.
64. Vasinajindakaw, P. et al. (2012) "Surface plasmonic enhanced polarimetric longwave infrared photodetection with band pass spectral filtering," *Semicond. Sci. Technol.* 27(6), 65005-65009.

We claim:
1. A method, comprising:
    (a) increasing the photocurrent by reflecting light with a backside configured surface plasmon structure integrated into a quantum dot infrared photodetector,
    (b) decreasing the dark current with an indium bump on top of silicon nitride passivation layer surrounding the backside configured surface plasmon structure, and
    (c) enhancing the photocurrent spectrum response of said quantum dot infrared photodetector by at least four times.
2. The method of claim 1, wherein the photocurrent spectrum response is enhanced by at least sixteen times.

3. The method of claim 1, wherein the quantum dot infrared photodetector is part of a focal plane array that incorporates said backside configured surface plasmon structure.

\* \* \* \* \*